US006171165B1

(12) United States Patent
Kim et al.

(10) Patent No.: US 6,171,165 B1
(45) Date of Patent: Jan. 9, 2001

(54) PRECISION ALIGNMENT OF MICROCOLUMN TIP TO A MICRON-SIZE EXTRACTOR APERTURE

(75) Inventors: Ho-Seob Kim, Milpitas; Kim Y. Lee, Fremont; T. H. P. Chang, Foster City, all of CA (US)

(73) Assignee: Etec Systems, Inc., Hayward, CA (US)

( * ) Notice: Under 35 U.S.C. 154(b), the term of this patent shall be extended for 0 days.

(21) Appl. No.: 09/197,092

(22) Filed: Nov. 19, 1998

(51) Int. Cl.$^7$ .................................. H01J 9/04; H01J 9/12

(52) U.S. Cl. .................................. 445/50; 445/35; 445/46

(58) Field of Search .................................. 445/49, 50, 51, 445/35, 46

(56) References Cited

U.S. PATENT DOCUMENTS

| | | | |
|---|---|---|---|
| 4,049,991 | 9/1977 | Collins | 313/417 |
| 4,309,638 | 1/1982 | Van Roosmalen et al. | 313/447 |
| 6,023,060 | * 2/2000 | Chang et al. | 250/310 |

OTHER PUBLICATIONS

Lee, Kang, and Chun. Micromachined Self Aligned Microlens (SAM) For Microcolumn Electron Beam. Microelectric Engineering 35 (1997) 413–416, 1997.*

Choi et al. Fabrication of Microelectron Gun Arrays Using Laser Micromachining. Microelectronic Emgineering 41/42 (1998) 167–170, 1998.*

Despont et al. Microfabrication of Lenses for a Miniaturized Electron Column. Microelectronic Engineering 27 (1995) 467–470, 1995.*

Despont et al. Electron Beam Microcolumn Fabrication and Testing. Microelectronic Engineering 30 (1996) 69–72, 1996.*

Zlatkin, Garcia. Low–energy (300 eV) Versatile Scanning Electron Microscope with 30 nm Resolution. Microelectronic Engineering 45 (1999) 39–46, 1997.*

S. Kleindiek, et al., "Miniature three–axis micropositioner for scanning proximal probe and other applications", Journal of Vacuum Science & Technology Bulletin, vol. 13, No. 6 Nov./Dec. 1995, pp. 2653–2656.

T. Chang, et al., "Electron–Beam Microcolumns for Lithography and Related Applications", Journal of Vacuum Science Technology Bulletin vol. 14, No. 6, pp. 3774–3781, Nov./Dec.1996.

"The Scanning Tunneling Microscope–What it is and how it works . . . ", http://www.iap.tuwien.ac.at/www/surface/STM_Gallery/stm_schematic.html.

"Scanning Tunneling Microscope Update 1997", http://www.umsl.edu/~fraundor/stm97x.html.

E. Kratchmer, et al., "Sub–40 nm resolution 1 keV scanning tunneling microscope field–emission microcolumn", Journal of Vacuum Science & Technology Bulletin, vol. 12 No. 6 Nov. 1 1994 pp. 3503.

Patent Abstracts of Japan, vol. 009, No. 023 (E–293), Jan. 30 1985 (JP 59 169130 A.

K.Y. Lee, et al., "High aspect ration aligned multilayer microstructure fabrication", Journal of Vacuum Science & Technology Bulletin, vol. 12, No. 6 Nov. 1 1994, pp. 3425–3430.

* cited by examiner

Primary Examiner—Kenneth J. Ramsey
Assistant Examiner—Michael J. Smith
(74) Attorney, Agent, or Firm—Skjerven, Morril, MacPherson, Franklin, and Friel

(57) ABSTRACT

A method and an accompanied apparatus for aligning an electron emitter with an extractor hole of a microcolumn. Four V-grooves, defined together with the window for forming the membrane and having bottoms situated on two axis are microfabricated on a chip. The axis intersect at a right angle and defines a center point for the extractor hole. The V-grooves are then used as references to align the electron emitter with the extractor hole, one axis at a time. The emitter is precisely aligned to the extractor hole because the extractor hole was formed with reference to the V-grooves. The thickness of the chip is used as the spacing reference between the emitter and the extractor.

11 Claims, 2 Drawing Sheets under the scanning tunneling telescope (STM) aided alignment principle were first introduced in the late 1980s. Electron beam microcolumns are used to form a finely focused electron beam and offer the advantages of extremely high resolution with improved beam current, small physical size, and low cost, and can be used in a wide variety of applications, such as electron beam lithography. See "Electron-Beam Microcolumns for Lithography and Related Applications" by Chang, T. et al., Journal of Vacuum Science Technology Bulletin 14(6), pp. 3774–3781, November/December 1996, incorporated herein by reference.

PRECISION ALIGNMENT OF MICROCOLUMN TIP TO A MICRON-SIZE EXTRACTOR APERTURE

FIELD OF THE INVENTION

This invention relates to electron beam microcolumns, and in particular to a methodology for aligning an electron emitter and an extractor hole of a microcolumn.

BACKGROUND OF THE INVENTION

Electron beam microcolumns based on microfabricated electron optical components and field emission sources operating under the scanning tunneling telescope (STM) aided alignment principle were first introduced in the late 1980s. Electron beam microcolumns are used to form a finely focused electron beam and offer the advantages of extremely high resolution with improved beam current, small physical size, and low cost, and can be used in a wide variety of applications, such as electron beam lithography. See "Electron-Beam Microcolumns for Lithography and Related Applications" by Chang, T. et al., Journal of Vacuum Science Technology Bulletin 14(6), pp. 3774–3781, November/December 1996, incorporated herein by reference.

The alignment principles used by microcolumns are similar to STMs in that a precision X-Y-Z positioner is used to control a sharp tip, in the case of a microcolumn a field emission tip, and to utilize the emission from the tip to measure the position of the tip. For additional information relating to three-axis micropositioners, see "Miniature Three-Axis Micropositioner for Scanning Proximal Probe and Other Applications," by S. Kleindiek et al., Journal of Vacuum Science Technology Bulletin 13(6), pp. 2653–2656, November/December 1995.

FIG. 1 is an exploded diagram of field emitter source 110 and electron optical column 120. Field emitter source 110 includes a field emitter tip 112, which may be a Zr/O/W Schottky field emitter tip or a cold-field emitter tip, such as a single crystal tungsten, hafnium carbide or diamond tip. Field emitter tip 112 is mounted on a miniature three-axis micropositioner 114. Micropositioner 114 has a range of movement in the order of tens of micrometers to more than 1 mm in each of the X-Y-Z directions and has subnanometer positioning capability. Micropositioner 114 is used to align field emitter tip 112 with electron optical column 120. Typical dimensions of miniature three-axis micropositioner 114 are approximately 2×2×1.1 cm.

The typical components of electron optical column 120 include a microsource lens 122 with an extractor 124 and an anode 128 with apertures of approximately a few micrometers and 100 μm in diameter, respectively. Extraction electrode 124 is fabricated from 2 μm thick silicon (Si) membrane with a bore diameter of a few microns. For optimum lens operation, emitter 112 is required to be positioned very closely and precisely aligned to extractor hole 126.

Due to the proximity of emitter source 110 to extractor 122, aligning emitter tip 112 to extractor hole 126 is difficult. The problem is exacerbated by the dimension of extractor electrode 124 and the overall column dimensions. For fine alignment, an STM-type X-Y positioner has been used in-situ to scan the tip over the extractor electrode. However, this approach requires time consuming scanning of relatively large areas.

Accordingly, it is clear that there is a need for a method to easily and precisely align an electron emitter and an extractor hole of a microcolumn.

SUMMARY OF THE INVENTION

In accordance with the present invention, a method and an accompanying apparatus for aligning an electron emitter with an extractor hole of a microcolumn are provided. Four V-grooves with their vertices situated on two axes are microfabricated on a chip. The axes intersect at a right angle and define a center point for the extractor hole. The V-grooves are then used as references to align the electron emitter with the extractor hole.

In one embodiment, four V-grooves are defined together with the window for forming the extraction electrode membrane and microfabricated in a chip. The extractor hole is formed with reference to the V-grooves. The emitter is then aligned with the extractor hole by referencing the V-grooves, one axis at a time. The emitter is precisely aligned to the extractor hole because the extractor hole was formed with reference to the V-grooves. In another embodiment, the thickness of the chip is used as the spacing reference between the emitter and the extractor.

DETAILED DESCRIPTION

Figure 1:
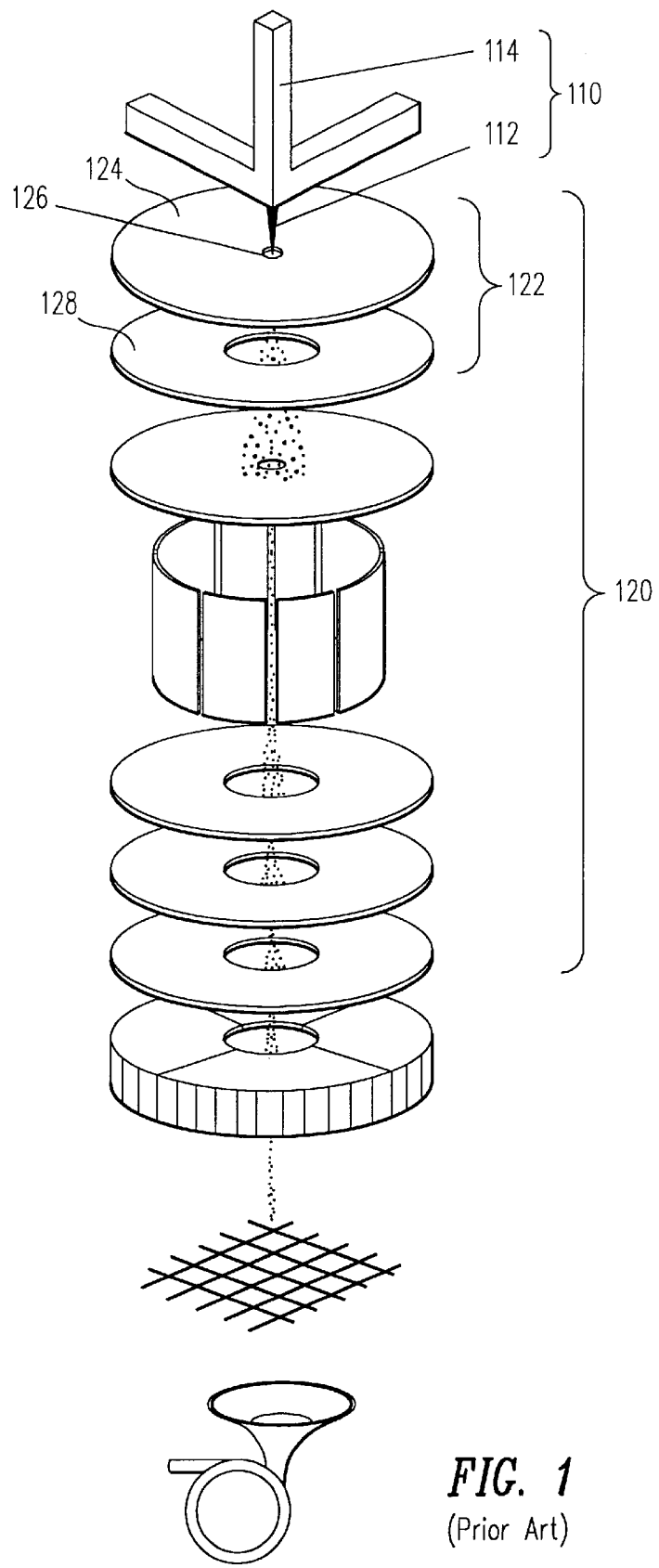
FIG. 1 illustrates an exploded view of a prior art microcolumn.
Figure 2:
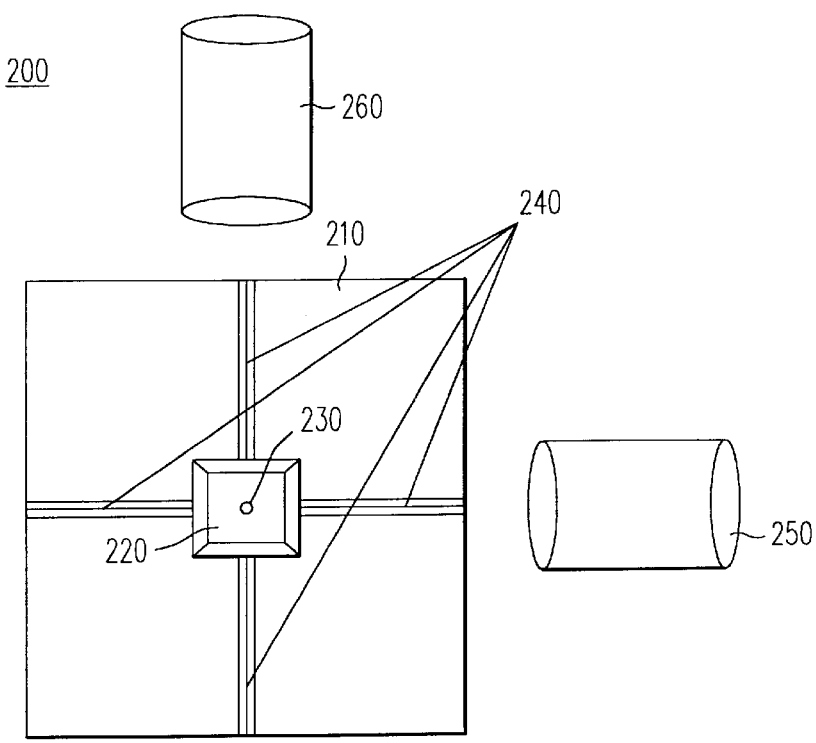
FIG. 2 illustrates a plan view chip with four V-grooves microfabricated therein.
Figure 3:
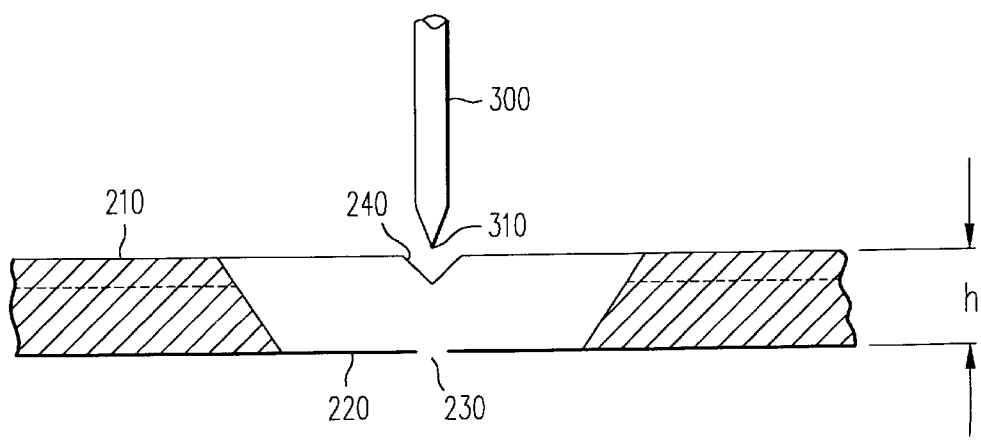
FIG. 3 illustrates alignment between an emitter and an extractor hole of a microcolumn.

FIG. 2 shows in a plan view a microfabricated extractor electrode 200 in accordance with the present invention. FIG. 3 shows alignment between extractor hole 230 and emitter 300. Microfabricated extractor electrode 200 is made from, for example, a 500 μm thick, 7 mm×7 mm silicon chip 210. Of course, chip 210 can be made from other materials, such as, but not limited to, molybdenum.

Four V-grooves 240 are formed in chip 210. The vertices of V-grooves 240 lie on two axes which intersect at a right angle, two grooves per axis. V-grooves 240 are preferably of V-shape so the vertices of the V-shaped grooves lie on two axes that intersect at a single point which is used to define the center of extractor hole 230. Other shapes such as narrow U-shaped grooves may also be used. The etched depth of V-grooves 240 is pre-determined by judicious choice of the starting widths. Because chip 210 is of silicon, conventional silicon processing techniques may be utilized. Such techniques are well known in the art and enable the etching in silicon to very precise tolerances. For example, patterning of V-grooves 240 is easily achievable with a 1-μm or better accuracy using a commercial contact printer/aligner, such as Karl-Suss BA/MA6. After the subsequent etching step, the dimensions of each V-groove 240 are intended to be e.g. 10–20 μm in width and 10–20 μm in depth.

A 1 to 1.5 μm thick, and typically 1 mm×1 mm membrane 220 is formed by suitable masking and etching at the center of silicon chip 210. The window for forming membrane 220 is defined with reference to V-grooves 240. A center aperture is etched in the center of membrane 220. The center aperture is the extractor hole of membrane 220 and is typically 1–5 μm in diameter. Note that extractor hole 230 shown in FIG. 2 and FIG. 3 is not to scale with respect to the rest of the components. Membrane 220 and extractor hole 230 are both defined using conventional silicon processing techniques. Spacing h between emitter 300 and extractor hole 230 ranges from e.g. 50 to 100 μm, depending on the operating condition.

Extractor hole 230 and V-grooves 240 are patterned on opposite surfaces of chip 210. Hence, the alignment involves a back-to-front surface alignment step. During this step, a V-groove image is captured by a suitable conventional telescope from the top of chip 210. The image of V-grooves 240 captured by the telescope is then superimposed onto the underside of chip 210 and used to pattern extractor hole 230 which is formed by etching from the bottom of chip 210. The center of extractor hole 230 is the intersecting point of the two axis on which V-grooves 240 are situated.

Two suitable conventional telescopes 250 and 260 are used to align extractor hole 230 and emitter 300 using V-grooves 240 as references. Each telescope 250, 260 is focused on each V-groove 240 at a shallow angle along its respective axis so that the telescope can observe all the way through the opposite V-groove 240. The angle needs only to be small because it only needs to be enough to accommodate the slight vibration of chip 210. Emitter tip 310 is then aligned to V-groove 240 one axis at a time. Once emitter tip 310 is aligned at the point where the axes intersect, it is automatically also aligned to extractor hole 230 because extractor hole 230 was formed using the intersection as its center point. The accuracy of the alignment, therefore, is dependent on the accuracy and the tolerance of alignment between V-grooves 240 and extractor hole 230.

Although FIG. 2 shows two telescopes 250 and 260, only one is required. In the case where only one telescope is used, the telescope focuses on one V-groove at a shallow angle along its axis so that it can see all the way through the opposite V-groove on the same axis. Chip 210 is then rotated 90° and the telescope focuses on another V-groove at a shallow angle along its axis so that it can see all the way through the opposite V-groove on that axis.

Another important issue in aligning emitter 300 and extractor hole 230 of a microcolumn is the spacing between emitter 300 and extractor hole 230, because the sizes of emitter tip 310 and extractor hole 230 are very small. A conventional non-microcolumn electron gun extractor hole diameter is typically 0.4 to 0.5 mm. Extractor hole 230 in a microcolumn, on the other hand, is 0.1 mm or less in diameter. Therefore, precision alignment is very important so that majority of the electrons from emitter 300 pass through extractor hole 230.

For spacing purpose, the thickness of chip 210 may be used as a reference. For example, emitter tip 310 is aligned to the top plane of chip 210 using one or both telescopes 250, 260. The distance between emitter tip 310 and extractor hole 230 is then the thickness of chip 210. This method of height adjustment entails using chip 210 with a thickness that matches the required emitter tip-extractor distance.

Although the invention has been described with reference to particular embodiments, the description is only an example of the invention's application and should not be taken as a limitation. Various other adaptations and combinations of features of the embodiments disclosed are within the scope of the invention as defined by the following claims.

We claim:

1. A method for aligning an emitter and an extractor hole of a microcolumn, comprising:

providing a chip;

defining a plurality of grooves in a surface of said chip;

defining a membrane at a center portion of said chip;

forming an extractor hole at a center of said membrane; and aligning said emitter to said extractor hole by referencing to said grooves.

2. The method of claim 1, wherein said chip comprises silicon.

3. The method of claim 1, wherein said chip comprises molybdenum.

4. The method of claim 1, wherein said plurality of grooves comprises four grooves, each of said four grooves having a vertex, each said vertex lying along one of two axes which intersect thereby to define a center point.

5. The method of claim 4, wherein said center point defines a center of said extractor hole.

6. The method of claim 1, further comprising defining a window for forming said membrane with reference to said grooves.

7. The method of claim 1, wherein forming said plurality of grooves comprises etching.

8. The method of claim 1, wherein forming said membrane comprises etching.

9. The method of claim 1, wherein forming said extractor hole further comprises forming a spatial reference with said grooves.

10. The method of claim 1, wherein aligning said emitter to said extractor hole further comprises:

observing along a first axis of said grooves;

observing along a second axis of said grooves;

aligning an emitter tip of said emitter to said grooves along said first axis; and aligning said emitter tip to said grooves along said second axis.

11. The method of claim 1, further comprising aligning an emitter tip of said emitter to a surface of said chip.

* * * * *

UNITED STATES PATENT AND TRADEMARK OFFICE
CERTIFICATE OF CORRECTION

PATENT NO.    : 6,171,165 B1
DATED         : January 9, 2001
INVENTOR(S)   : Ho-Seob Kim et al.

It is certified that error appears in the above-identified patent and that said Letters Patent is hereby corrected as shown below:

Column 1,
Line 3, below the Title, insert the following:
-- This invention was made with U.S. Government support under Contract No.: N00019-95-C-0059 awarded by the Department of the Navy. The Government has certain rights in this invention. --.

Signed and Sealed this

Twenty-eighth Day of January, 2003

JAMES E. ROGAN
*Director of the United States Patent and Trademark Office*